United States Patent
Shih et al.

(10) Patent No.: US 10,340,149 B2
(45) Date of Patent: Jul. 2, 2019

(54) METHOD OF FORMING DENSE HOLE PATTERNS OF SEMICONDUCTOR DEVICES

(71) Applicant: NANYA TECHNOLOGY CORPORATION, New Taipei (TW)

(72) Inventors: Shing-Yih Shih, New Taipei (TW); Jen-Jui Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/695,028

(22) Filed: Sep. 5, 2017

(65) Prior Publication Data

US 2019/0074187 A1 Mar. 7, 2019

(51) Int. Cl.
*H01L 21/308* (2006.01)

(52) U.S. Cl.
CPC ...... *H01L 21/3088* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 9,034,765 B2 * | 5/2015 | Park | H01L 21/0337 438/702 |
| 9,159,560 B2 | 10/2015 | Seo | |
| 9,455,177 B1 | 9/2016 | Park et al. | |
| 9,466,534 B1 * | 10/2016 | Brink | H01L 21/82343 |
| 9,842,931 B1 * | 12/2017 | Anderson | H01L 29/785 |
| 9,922,920 B1 * | 3/2018 | Lin | H01L 23/49827 |
| 9,997,371 B1 * | 6/2018 | Agarwal | H01L 21/31056 |
| 2010/0136792 A1 * | 6/2010 | Mebarki | H01L 21/0337 438/703 |
| 2011/0248382 A1 * | 10/2011 | Pellizzer | H01L 27/1022 257/539 |
| 2012/0085991 A1 * | 4/2012 | Cohen | B82Y 10/00 257/28 |
| 2013/0115778 A1 * | 5/2013 | Xue | H01L 21/02181 438/703 |
| 2013/0330660 A1 * | 12/2013 | Wang | H01L 21/76816 430/5 |
| 2014/0273471 A1 | 9/2014 | Gwak | |
| 2015/0126042 A1 * | 5/2015 | Pasquale | H01L 21/02274 438/761 |
| 2016/0005596 A1 * | 1/2016 | Behera | H01L 21/02115 438/703 |
| 2016/0293442 A1 * | 10/2016 | Ban | H01L 21/31144 |

(Continued)

*Primary Examiner* — Allan W. Olsen
(74) *Attorney, Agent, or Firm* — CKC & Partners Co., LLC (57) ABSTRACT

A method of forming dense hole patterns of semiconductor devices includes: forming a plurality of first pillars on at least one lower hard mask layer disposed on a substrate; forming a spacer layer on the lower hard mask layer to form a plurality of second pillars respectively covering the first pillars, wherein a plurality of first holes are formed among the second pillars; etching the spacer layer to expose first portions of the lower hard mask layer via the first holes and expose top surfaces of the first pillars; removing the first pillars to form a plurality of second holes in the spacer layer to expose second portions of the lower hard mask layer; etching the first portions and the second portions of the lower hard mask layer at least until portions of the substrate are exposed; and removing remaining portions of the spacer layer.

12 Claims, 8 Drawing Sheets

(56) References Cited

U.S. PATENT DOCUMENTS

2017/0076957 A1\* 3/2017 Lee .................... H01L 21/31144
2018/0061640 A1\* 3/2018 Liu .................... H01L 21/02274
2018/0138040 A1\* 5/2018 LaVoie .............. H01L 21/31051

\* cited by examiner

METHOD OF FORMING DENSE HOLE PATTERNS OF SEMICONDUCTOR DEVICES

BACKGROUND

Technical Field

The present disclosure relates to a method of forming dense hole patterns of semiconductor devices.

Description of Related Art

As the degree of integration of semiconductor devices increases, various double patterning technologies for forming dense hole patterns having a pitch or a diameter smaller than the minimum resolution of a photolithography process have been developed.

In general, there are two major double patterning techniques (DPT): Litho-Etch-Litho-Etch (LELE) Double Patterning technique and Self-Aligned Double Patterning (SADP) technique. LELE is much more mature than SADP in terms of process development and design flow implementation, while SADP has stronger scaling potential than LELE due to its smaller design rules on tip-tip and tip-side as well as its intrinsic self-align property.

SUMMARY

An aspect of the disclosure is to provide a method of forming dense hole patterns of semiconductor devices.

According to an embodiment of the disclosure, the method of forming dense hole patterns includes: forming a plurality of first pillars on at least one lower hard mask layer disposed on a substrate; forming a spacer layer on the lower hard mask layer to form a plurality of second pillars respectively covering the first pillars, wherein a plurality of first holes are formed among the second pillars; etching the spacer layer to expose first portions of the lower hard mask layer via the first holes and expose top surfaces of the first pillars; removing the first pillars to form a plurality of second holes in the spacer layer to expose second portions of the lower hard mask layer; etching the first portions and the second portions of the lower hard mask layer at least until portions of the substrate are exposed; and removing remaining portions of the spacer layer.

In an embodiment of the disclosure, the forming the first pillars includes: forming an upper hard mask layer on the lower hard mask layer; forming a plurality of dots on the upper hard mask layer; etching an exposed portion of the upper hard mask layer exposed by the dots, in which remaining portions of the upper hard mask layer serve as the first pillars; and removing the dots.

In an embodiment of the disclosure, the method further includes trimming the dots before the etching the exposed portion of the upper hard mask layer.

In an embodiment of the disclosure, the forming the first pillars includes forming the first pillars based on a first matrix constituting of a first dimension and a second dimension.

In an embodiment of the disclosure, the forming the first pillars further includes equidistantly forming the first pillars based on the first matrix.

In an embodiment of the disclosure, an angle formed between the first and second dimensions is about 60 degrees.

In an embodiment of the disclosure, the first holes and the second holes are arranged based on a second matrix constituting of a third dimension and a fourth dimension.

In an embodiment of the disclosure, in at least one of the third and fourth dimensions, adjacent two of the first holes are arranged between corresponding two of the second holes.

In an embodiment of the disclosure, an angle formed between the third and fourth dimensions is about 60 degrees.

In an embodiment of the disclosure, an angle formed between the first dimension and at least one of the third and fourth dimensions is about 30 degrees.

In an embodiment of the disclosure, each of the first holes is formed among adjacent three of the second pillars before the etching the spacer layer.

In an embodiment of the disclosure, the second pillars are arranged in a closely-packed manner.

In an embodiment of the disclosure, the etching the first portions and the second portions of the lower hard mask layer comprising etching the lower hard mask layer at least until portions of the substrate are exposed.

Accordingly, the method of forming dense hole patterns of semiconductor devices of the disclosure can effectively form dense hole patterns having a pitch or a diameter smaller than minimum resolution of a photolithography process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that, if an element is referred to as being "connected" or "coupled" to another element, it can be directly connected, or coupled, to the other element or intervening elements may be present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the disclosure provide a method of forming dense hole patterns of semiconductor devices.

Figure 1A:
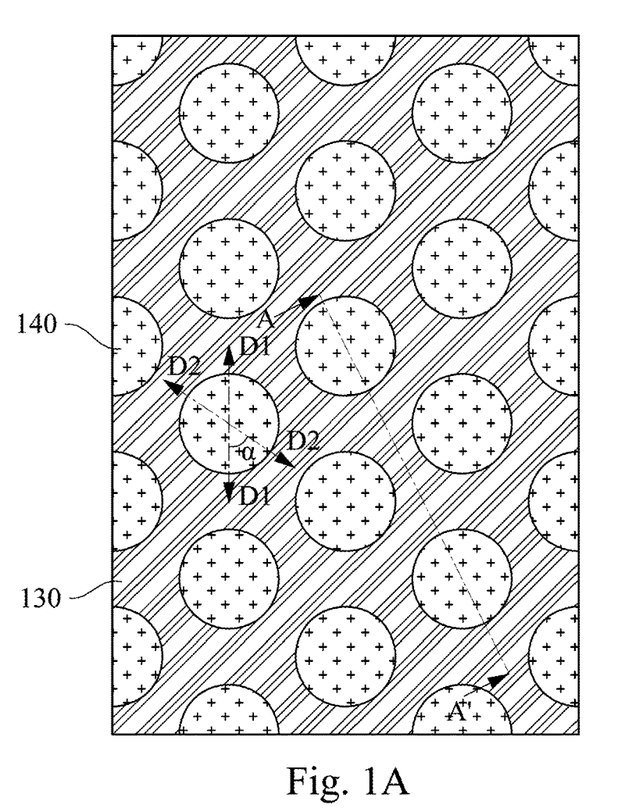
FIGS. 1A, 2A, 3A, 4A, 5A, 6A, 7A, and 8A are top views illustrating a method of forming dense hole patterns of semiconductor devices according to some embodiments of the disclosure.
Figure 1B:
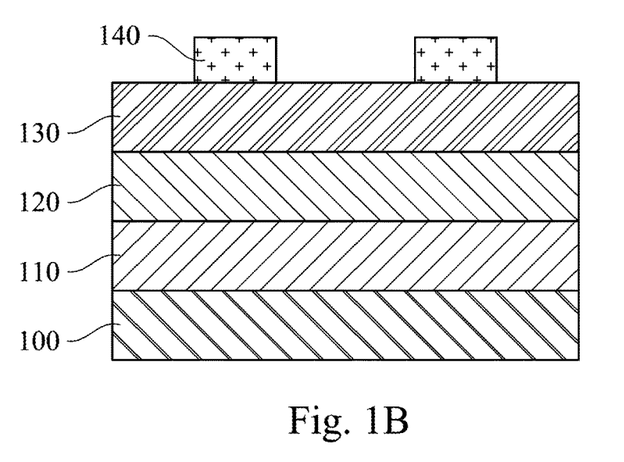
FIGS. 1B, 2B, 3B, 4B, 5B, 6B, 7B, and 8B are longitudinal cross-sectional views taken along line A-A' of FIGS. 1A, 2A, 3A, 4A, 5A, 6A, 7A, and 8A, respectively.

Reference is made to FIGS. 1A and 1B. In some embodiments, the method of forming dense hole patterns may include: forming a first lower hard mask layer 110 on a substrate 100; forming a second lower hard mask layer 120 on the first lower hard mask layer 110; forming an upper hard mask layer 130 on the second lower hard mask layer 120; and forming a plurality of dots 140 on the upper hard mask layer 130. In some embodiments, the second lower hard mask layer 120 can be omitted, and the upper hard mask layer 130 is formed on the first lower hard mask layer 110.

In some embodiments, the forming the dots 140 may include forming the dots 140 based on a first matrix constituting of a first dimension D1 and a second dimension D2. In some embodiments, the forming the dots 140 may further include equidistantly forming the dots 140 based on the first matrix. In some embodiments, the pitch of the dots 140 in any of the first dimension D1 and the second dimension D2 is equal to the minimum pitch which can be formed by photolithography equipment.

In some embodiments, an angle α formed between the first dimension D1 and the second dimension D2 is about 60 degrees, but the disclosure is not limited in this regard.

In some embodiments, the first lower hard mask layer 110 may include silicon (Si), silicon dioxide ($SiO_2$), silicon nitride (SiN), silicon oxynitride (SiON), etc. In some embodiments, the second lower hard mask layer 120 may include Si, $SiO_2$, SiN, SiON, silicon carbide (SiC), etc. In some embodiments, the upper hard mask layer 130 may include SiN, silicon monoxide (SiO), SiON, SiC, carbon, silicon based material, etc.

Figure 2A:
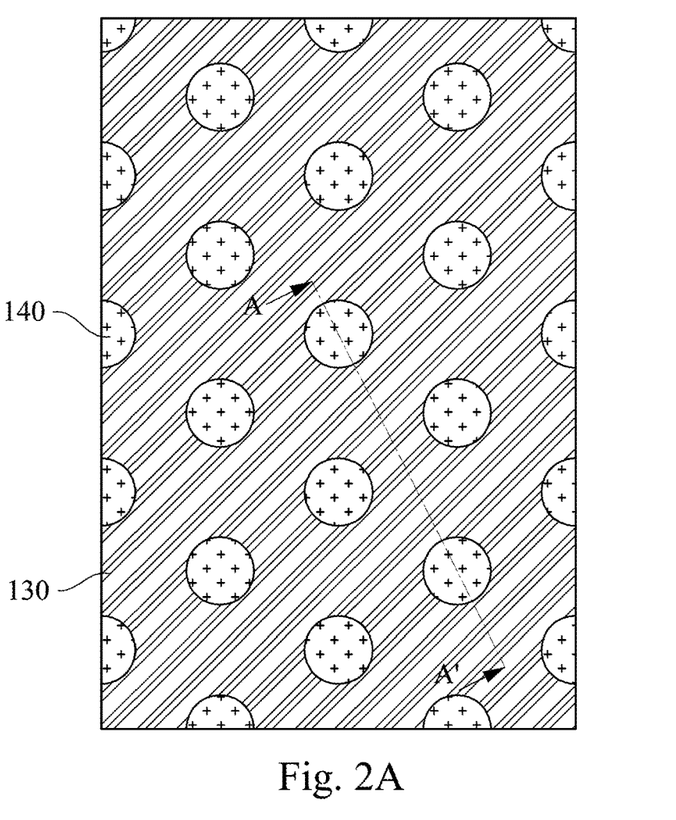
Figure 2B:
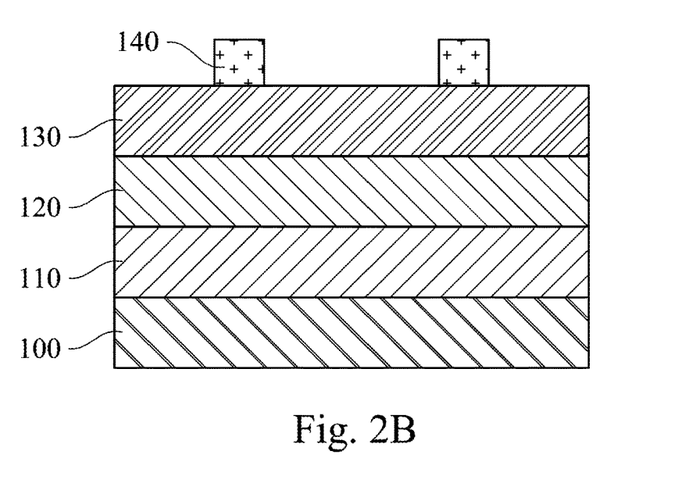

Reference is made to FIGS. 2A and 2B. In some embodiments, the method of forming dense hole patterns may include trimming the dots 140. In some embodiments, the trimming the dots 140 makes a diameter of the trimmed dots 140 be smaller than the pitch of the dots 140 in any of the first dimension D1 and the second dimension D2.

Figure 3A:
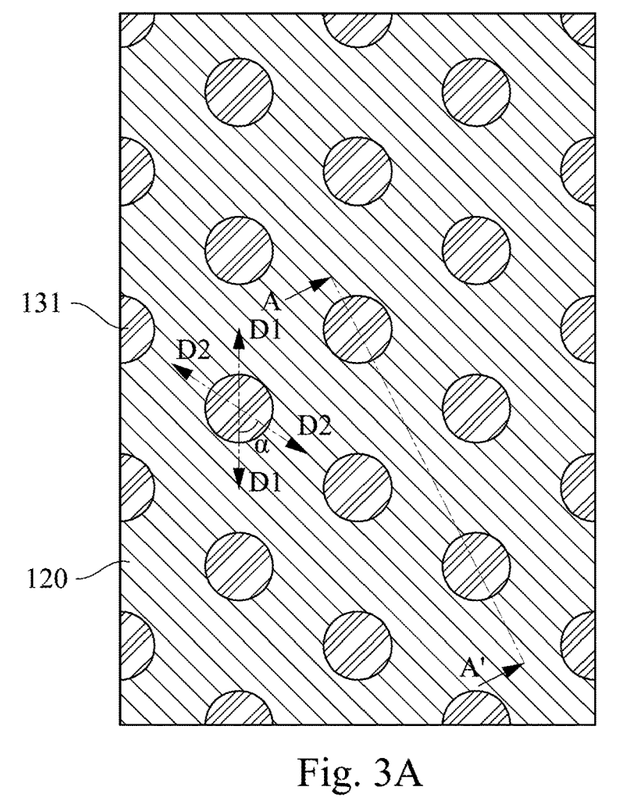
Figure 3B:
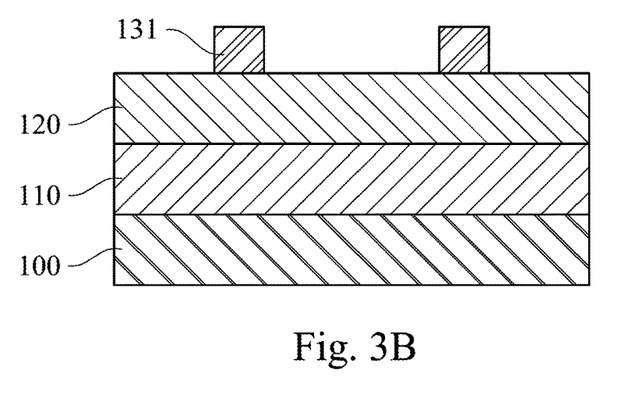

Reference is made to FIGS. 3A and 3B. In some embodiments, the method of forming dense hole patterns may include etching an exposed portion of the upper hard mask layer 130 exposed by the trimmed dots 140, in which remaining portions of the upper hard mask layer 130 form a plurality of first pillars 131. In some embodiments, the etching the exposed portion of the upper hard mask layer 130 may be performed by a dry etching process.

In some embodiments, the forming the first pillars 131 may include forming the first pillars 131 based on the first matrix constituting of the first dimension D1 and the second dimension D2. In some embodiments, the forming the first pillars 131 may further include equidistantly forming the first pillars 131 based on the first matrix.

Figure 4A:
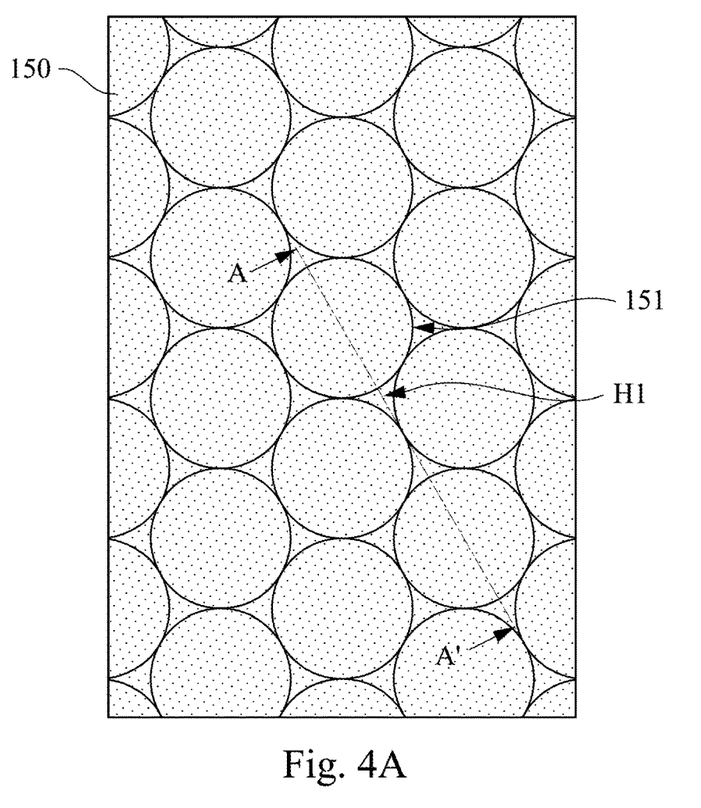
Figure 4B:
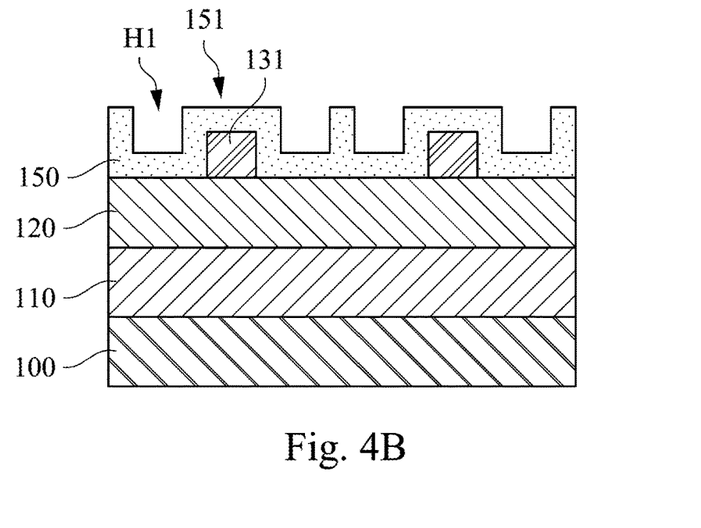

Reference is made to FIGS. 4A and 4B. In some embodiments, the method of forming dense hole patterns may include forming a spacer layer 150 on the second lower hard mask layer 120 to form a plurality of second pillars 151 respectively covering the first pillars 131, in which a plurality of first holes H1 are formed among the second pillars 151. In some embodiments, the forming the spacer layer 150 may be performed by depositing.

In some embodiments, the second pillars 151 are arranged in a closely-packed manner. That is, except for the second pillars 151 arranged at the outer circumferential edge, each of the rest of the second pillars 151 is connected among six adjacent second pillars 151. In some embodiments, each of the first holes H1 is formed among adjacent three of the second pillars 151. In some embodiments, except for the second pillars 151 arranged at the outer circumferential edge, each of the rest of the second pillars 151 adjoins six first holes H1.

Figure 5A:
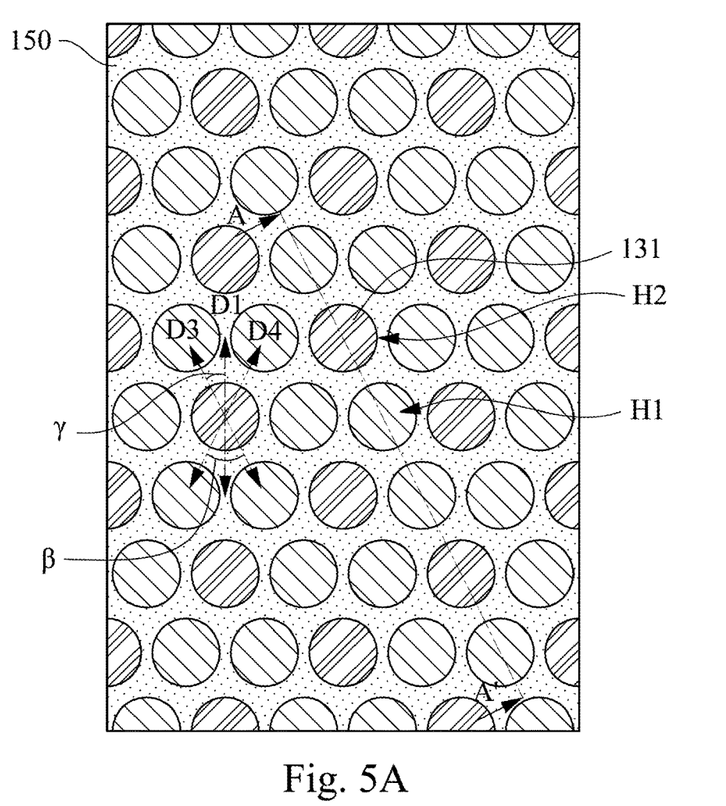
Figure 5B:
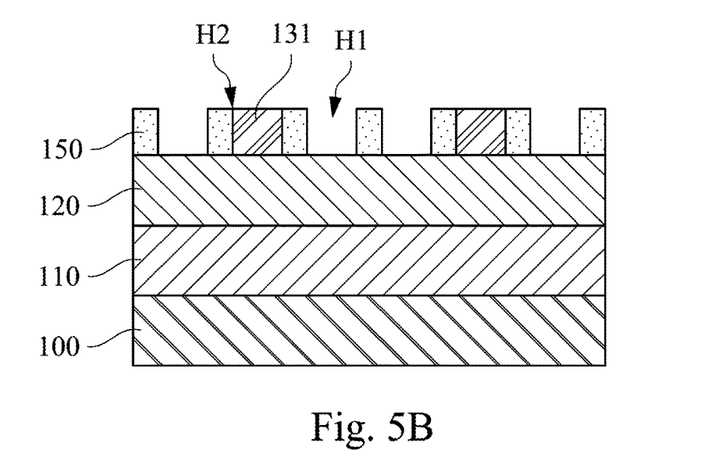

Reference is made to FIGS. 5A and 5B. In some embodiments, the method of forming dense hole patterns may include etching the spacer layer 150 to expose first portions of the second lower hard mask layer 120 via the first holes H1 and expose top surfaces of the first pillars 131. That is, each of the first portions of the second lower hard mask layer 120 is located right under a corresponding one of the first holes H1. In some embodiments, the etching the spacer layer 150 may include removing portions of the spacer layer 150 on top surfaces of the second lower hard mask layer 120 and the first pillars 131.

In some embodiments, the forming the spacer layer 150 may include blanket forming the spacer layer 150 by Atomic layer deposition (ALD). In some embodiments, the removing the portions of the spacer layer 150 on the top surfaces of the second lower hard mask layer 120 and the first pillars 131 is performed by etching horizontal portions of the spacer layer 150.

In some embodiments, the spacer layer 150 may include SiN, SiO, etc.

Figure 6A:
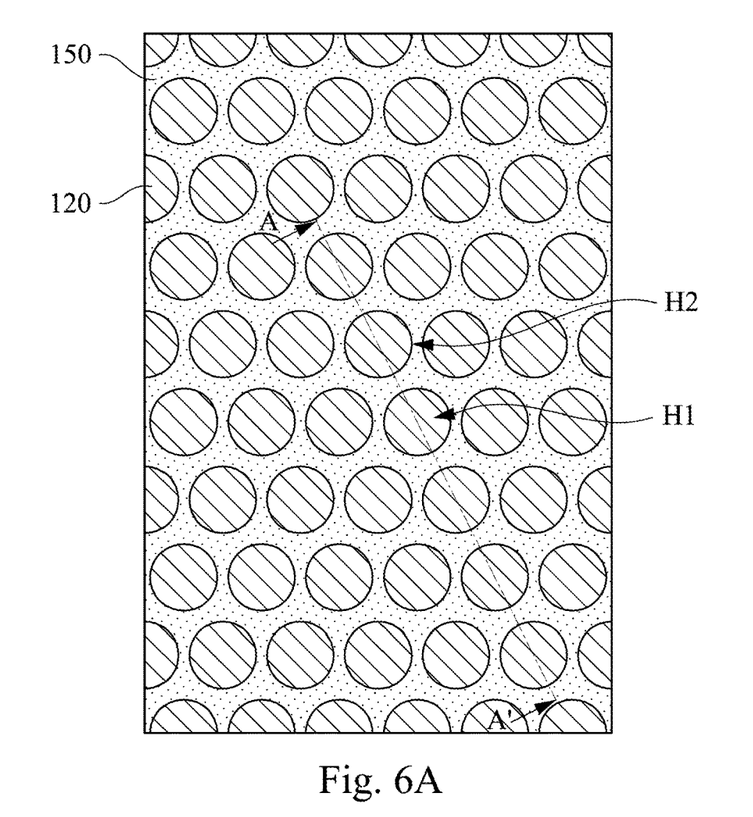
Figure 6B:
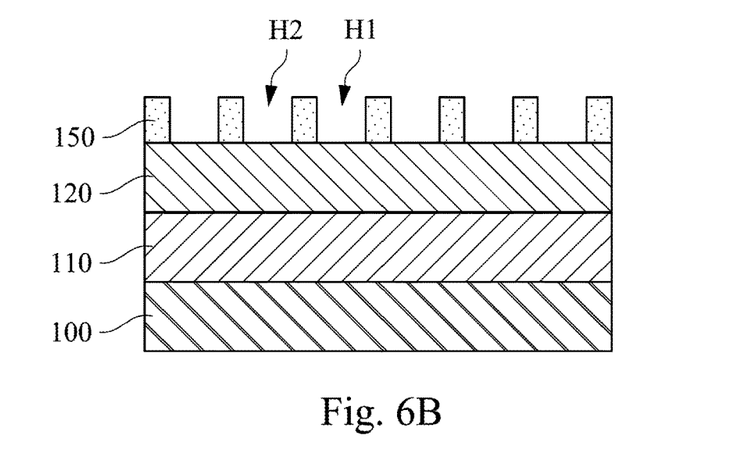

Reference is made to FIGS. 6A and 6B. In some embodiments, the method of forming dense hole patterns may include removing the first pillars 131 to form a plurality of second holes H2 in the spacer layer 150 to expose second portions of the second lower hard mask layer 120. That is, each of the second portions of the second lower hard mask layer 120 is located right under a corresponding one of the first pillars 131. Locations of the second holes H2 can be referred to locations of the first pillars 131 shown in FIG. 5A.

In some embodiments, the first pillars 131 are made of a photoresist material and can be removed by burning off using oxide, but the disclosure is not limited in this regard. After the removal of the first pillars 131, the second holes H2 are formed in the spacer layer 150 respectively.

In some embodiments, the first holes H1 and the second holes H2 are arranged based on a second matrix constituting of a third dimension D3 and a fourth dimension D4 (referring to FIG. 5A). In some embodiments, except for the first holes H1 arranged at the outer circumferential edge, any adjacent two of the first holes H1 are arranged between corresponding two of the second holes H2 (which are originally occupied by two first pillars 131) in at least one of the third dimension D3 and the fourth dimension D4 (referring to FIGS. 5A and 6A). In some embodiments, an angle β formed between the third dimension D3 and the fourth dimension D4 is about 60 degrees (referring to FIG. 5A). In some embodiments, an angle α formed between the first dimension D1 and at least one of the third dimension D3 and the fourth dimension D4 is about 30 degrees (referring to FIG. 5A).

Figure 7A:
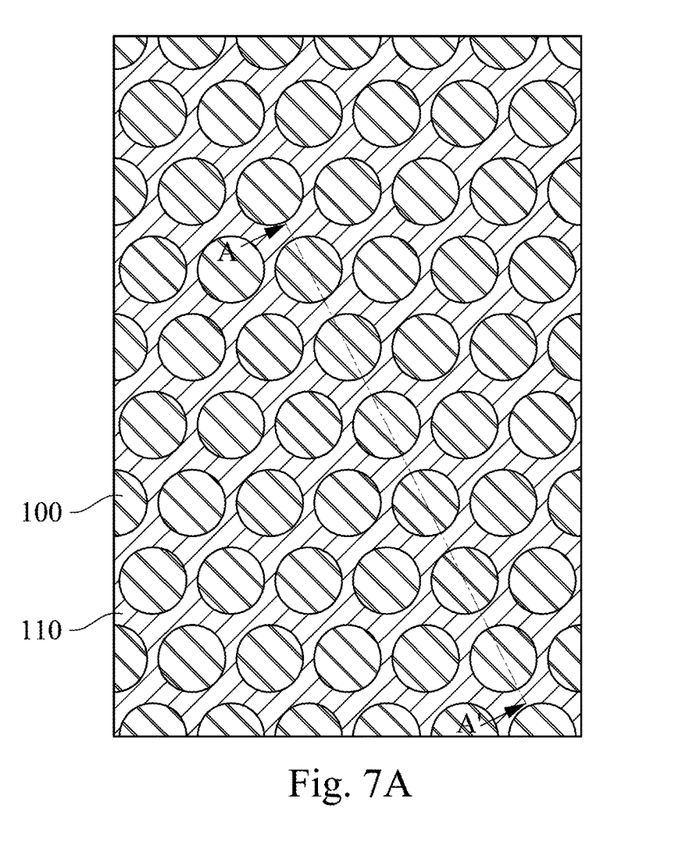
Figure 7B:
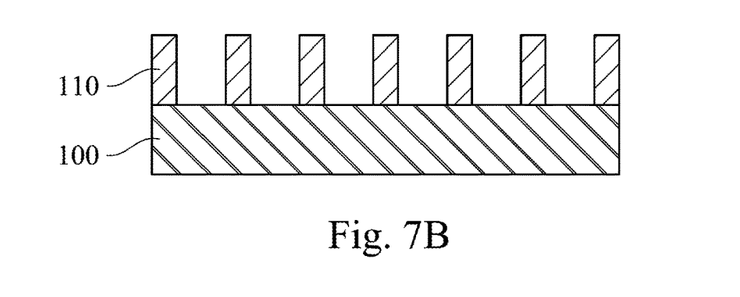

Reference is made to FIGS. 7A and 7B. In some embodiments, the method of forming dense hole patterns may include etching the first portions and the second portions of the second lower hard mask layer 120 at least until portions of the substrate 100 are exposed. In some embodiments, the etching the second lower hard mask layer 120 is performed until the exposed portions of the substrate 100 are etched. As a result, dense hole patterns can be successfully transferred into the first lower hard mask layer 110 and the second lower hard mask layer 120. In some embodiments, the method of forming dense hole patterns may include removing remaining portions of the spacer layer 150. As a result, dense hole patterns can be successfully transferred into the substrate 100.

Figure 8A:
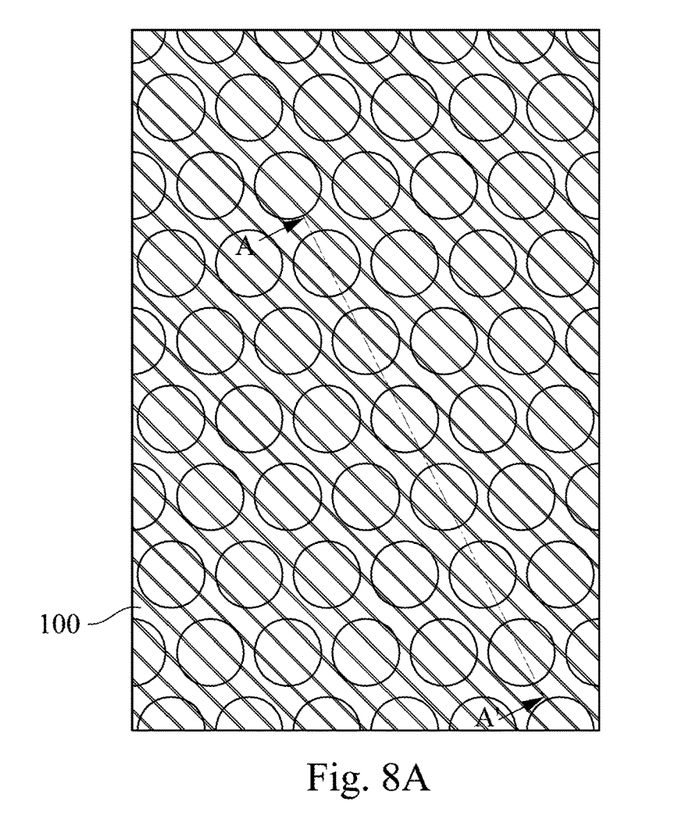
Figure 8B:
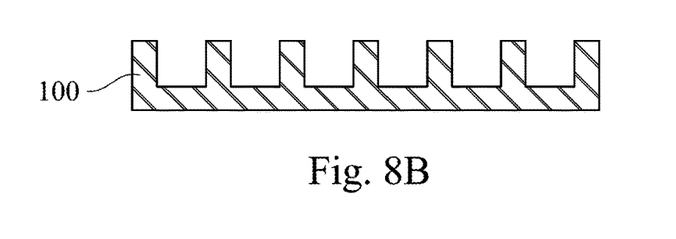

Reference is made to FIGS. 8A and 8B. In some embodiments, the method of forming dense hole patterns may include removing remaining portions of the first lower hard mask layer 110 and the second lower hard mask layer 120.

According to the foregoing recitations of the embodiments of the disclosure, it can be seen that the dense hole patterns formed by the various embodiments of the disclosure may have two times or more pattern density through deposition/etching processes for hole patterns having a minimum pitch or a minimum diameter which can be formed by photolithography equipment. Therefore, degree of integration of the semiconductor devices may be improved and the dense hole patterns may be stably formed by simple processes since advanced photolithography processes for forming dense hole patterns may not be excessively used. In other words, the methods of forming dense hole patterns of semiconductor devices according to various embodiments may provide formation of high density island patterns using one photolithography process and deposition and etch back processes of well-known materials without using high-priced semiconductor fabrication equipments, processes, and materials.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming dense hole patterns, the method comprising:
   forming a plurality of first pillars on at least one lower hard mask layer disposed on a substrate;
   blanket forming a spacer layer on the lower hard mask layer by Atomic layer deposition to form a plurality of second pillars respectively covering the first pillars, wherein a plurality of first holes are formed among the second pillars, and each of the first holes is enclosed by three of the second pillars;
   etching the spacer layer to expose first portions of the lower hard mask layer via the first holes and expose top surfaces of the first pillars;
   removing the first pillars to form a plurality of second holes in the spacer layer to expose second portions of the lower hard mask layer;
   etching the first portions and the second portions of the lower hard mask layer; and
   removing remaining portions of the spacer layer.

2. The method of claim 1, wherein the forming the first pillars comprises:
   forming an upper hard mask layer on the lower hard mask layer;
   forming a plurality of dots on the upper hard mask layer;
   etching an exposed portion of the upper hard mask layer exposed by the dots, wherein remaining portions of the upper hard mask layer serve as the first pillars; and
   removing the dots.

3. The method of claim 2, further comprising:
   trimming the dots before the etching the exposed portion of the upper hard mask layer.

4. The method of claim 1, wherein the forming the first pillars comprises:
   forming the first pillars based on a first matrix constituting of a first dimension and a second dimension.

5. The method of claim 4, wherein the forming the first pillars further comprises:
   equidistantly forming the first pillars based on the first matrix.

6. The method of claim 5, wherein an angle formed between the first and second dimensions is about 60 degrees.

7. The method of claim 4, wherein the first holes and the second holes are arranged based on a second matrix constituting of a third dimension and a fourth dimension.

8. The method of claim 7, wherein in at least one of the third and fourth dimensions, adjacent two of the first holes are arranged between corresponding two of the second holes.

9. The method of claim 7, wherein an angle formed between the third and fourth dimensions is about 60 degrees.

10. The method of claim 9, wherein an angle formed between the first dimension and at least one of the third and fourth dimensions is about 30 degrees.

11. The method of claim 1, wherein the second pillars are arranged in a closely-packed manner.

12. The method of claim 1, wherein the etching the first portions and the second portions of the lower hard mask layer comprising etching the lower hard mask layer at least until portions of the substrate are exposed.

* * * * *